United States Patent [19]
Corley et al.

[11] Patent Number: 4,928,002
[45] Date of Patent: May 22, 1990

[54] METHOD OF RECORDING TEST RESULTS OF DIE ON A WAFER

[75] Inventors: Dean Corley, Tempe; Hugh Littlebury, Chandler, both of Ariz.

[73] Assignee: Motorola Inc., Schaumburg, Ill.

[21] Appl. No.: 278,882

[22] Filed: Dec. 5, 1988

[51] Int. Cl.⁵ .............................. G06K 13/04
[52] U.S. Cl. .................... 235/479; 235/454; 235/383
[58] Field of Search ............ 235/383, 454, 479

[56] References Cited
U.S. PATENT DOCUMENTS 4,570,058 2/1986 Hauassy .................. 235/379

Primary Examiner—Harold I. Pitts
Attorney, Agent, or Firm—Joe E. Barbee

[57] ABSTRACT

A method which eliminates ink marking of die on a wafer uses a printer to print information of the test results in a digitally formatted manner. This information, preferably on a piece of paper, is then transferred with the wafer to a die bonder which selects the good die to be further processed.

7 Claims, 1 Drawing Sheet

METHOD OF RECORDING TEST RESULTS OF DIE ON A WAFER

BACKGROUND OF THE INVENTION

This invention relates, in general, to recording test results and location of a die after a wafer probe test, and more particularly, to a method for recording test results and location of a die on a wafer which avoids marking the wafer with ink.

Maintaining an electronic data base of wafer map information involves unacceptable risks of loss of data and misidentified wafers. It is common practice in the semiconductor industry to place an ink dot on rejected die of a wafer at probe test. At a die bond station these dots are detected with an automatic electronic vision system. Using an ink dot to indicate rejected die causes many problems. The inker requires set up time as well as continuous maintenance. There is difficulty in controlling the consistency of the ink used. Occasionally the ink will splatter and contaminate neighboring good die. It is not uncommon for the ink dot to fall off or for the ink dot to be difficult to be recognized on certain die by the automatic electronic vision system. Failure to detect a failed die results in the die bonder processing a bad die. Also, the semiconductor factory of the future must become inkless to allow multiple categorization of good die (grade A, grade B, etc.) on a semiconductor wafer. It should therefore be appreciated that it would be desirable to provide a method that overcomes the above indicated deficiencies.

Accordingly, it is an object of the present invention to eliminate applying ink to a die in order to indicate its tests results.

Another object of the present invention is to apply state of the art recording and scanning techniques to record test results of a die.

SUMMARY OF THE INVENTION

The above and other objects and advantages of the present invention are provided by a method which indicates the test results of a die on a wafer without inking the die itself. This is achieved by recording the test results on a wafer map or by digitally encoding the information on a medium such as paper or the like. The information is then read by a reader such as an optical scanner at the next work station, which is typically a die bonding station.

DETAILED DESCRIPTION OF THE DRAWINGS

Figure 1:
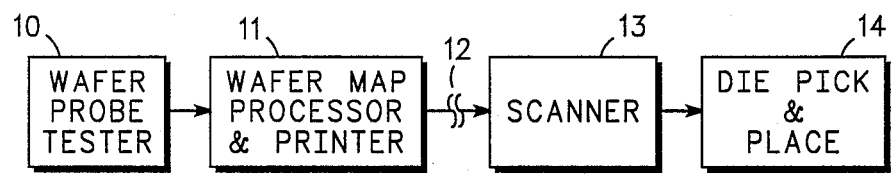
FIG. 1 illustrates in block diagram form an outline of the method of the present invention.

FIG. 1 illustrates, in block diagram form, a flow diagram of one embodiment of the present invention. A wafer having a plurality of die is tested at a wafer probe tester 10. The test results from probe tester 10 are monitored by a microprocessor which can map the wafer under test and digitally encode the information and supply it to a printer. This procedure is illustrated by block 11. The laser printer can print the information relating to each die of the wafer map to indicate a range of test parameters passed by each die. In addition, the printer can print in a digitally formatted manner the test results on a piece of paper. In a preferred embodiment, the piece of paper used is a Softstrip (trademark of Cauzin Systems Inc.). The information is digitally encoded using a redundant and error checked code. Softstrip TM can withstand wrinkles, scratches, and ink marks.

The wafer along with the printed material is then transferred to a scanner such as an optical scanner 13. The transfer as indicated by broken line 12 can either be an adjoining work location or could even be an overseas assembly operation. In cases where the tested wafer is to be shipped long distances it may be desirable to laser mark the wafer with an identifying number which corresponds with an identifying number on the printed information. Scanner 13 can then verify that the printed information being processed corresponds to the accompanying wafer. If the information is transferred on a Softstrip TM then scanner 13 can be a scanning device or reader adapted to read and decode the digitally formatted information. This information is then used to control a die pick and place portion of a die bonder illustrated by block 14.

Figure 2:
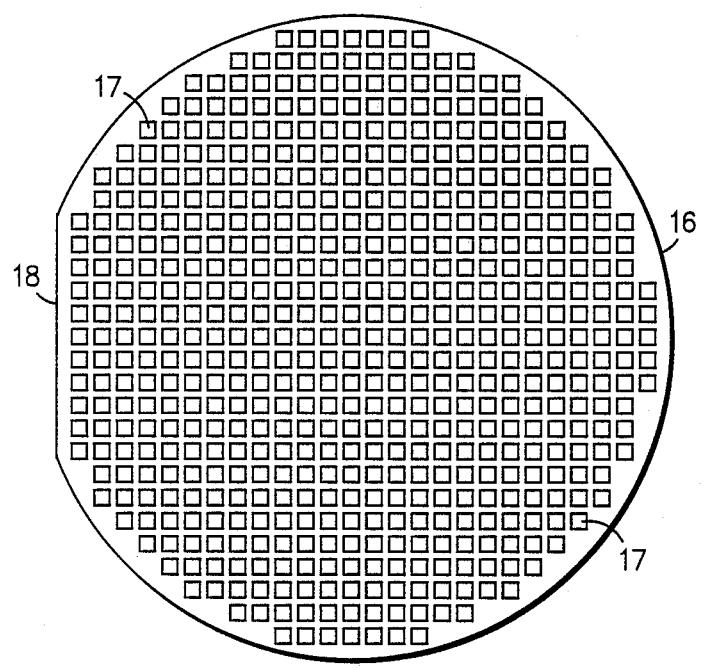
FIG. 2 illustrates a wafer map useful in understanding the present invention.

Typically, apparatus 14 will place the good die from the wafer onto a leadframe so that the die can be wire bonded to the leadframe. This operation is well known to the worker in the art. Since the pick and place apparatus will have the test results and die location from wafer probe tester 10 it will only select the desired die FIG. 2 illustrates a semiconductor wafer 16 having a plurality of die 17. Typically wafer 16 has a flat edge 18. Edge 18 can be used for rough alignment and orientation. Wafer probe tester 10, illustrated in FIG. 1, has a plurality of electrical probes which make contact with contact pads located on each die 17. The die is then tested and the test results are printed on a medium such as paper with a printer such as a laser printer or the like. The paper along with the wafers are then transferred to the next assembly station wherein the information is read by a scanner. Die pick and place mechanism 14 then selects the good die 17 from wafer 16 for further assembly.

Wafer map processor and printer 11 is also capable of printing the test results on a wafer map which is a layout of the die on the wafer similar to FIG. 2. The printer could actually print a coded letter or number in each die location on the map of the wafer which would indicate pass or fail, or could indicate a range of parameters the die met, e.g. grade A, grade B, etc.

The use of this invention results in the elimination of having to mark the bad die with ink at probe test. This avoids problems such as outlined hereinbefore. By having the test results printed on a piece of paper that can accompany the wafer the recipient of the wafer and paper map can visually scan the information to verify that it is present. The recipient then inserts the information along with the wafer into a die bonder. The printed information avoids loss of data from a data base due to an electronic failure or malfunction, or the loss of data caused by exposing the electronic data transfer medium to radiation or a magnetic field.

What is claimed is:

1. A method of recording test results and location of die on a wafer, comprising: testing each die on the wafer; encoding the test results in a coded format on a piece of paper using a printer to record on the paper; transferring the wafer along with the piece of paper to a die pick and place machine; and scanning the piece of paper with an optical reader to determine which die to select.

2. The method of claim 1 wherein only information identifying quality and location of die is recorded on the piece of paper.

3. A method of transferring test results of die on a wafer from one location to another location, comprising: testing all the die on the wafer; recording in an encoded format at least information relating to quality and location of die in a manner so the information is visibly noticeable; transferring the wafer along with the encoded information from the testing location to another location; and electronically reading the encoded information with an optical reader.

4. The method of claim 3 wherein the recording is done with a printer.

5. The method of claim 3 wherein the encoded format is a digital format.

6. A method of indicating test results of die on a wafer which avoids marking the die itself, comprising: providing a wafer map which is a layout of the die on the wafer; recording on the wafer map information of the test results of at least those die that failed; recording in a digital format further information concerning the test results and the location of the die on the wafer; and shipping the wafer and the recorded information together to a subsequent die processing location.

7. The method of claim 6 wherein information of the test results further includes information indicating at least one set of parameters passed by each die.

* * * * *